(12) United States Patent
Sun et al.

(10) Patent No.: US 9,147,454 B2
(45) Date of Patent: Sep. 29, 2015

(54) MAGNETIC TUNNELING JUNCTION NON-VOLATILE REGISTER WITH FEEDBACK FOR ROBUST READ AND WRITE OPERATIONS

(71) Applicant: QUALCOMM Incorporated, San Diego, CA (US)

(72) Inventors: Zhenyu Sun, New York, NY (US); Raghu Sagar Madala, San Diego, CA (US); Senthil Kumar Govindaswamy, San Diego, CA (US); Kendrick H. Yuen, San Diego, CA (US); Wenqing Wu, San Diego, CA (US); Peiyuan Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 361 days.

(21) Appl. No.: 13/792,440

(22) Filed: Mar. 11, 2013

(65) Prior Publication Data
US 2014/0198563 A1 Jul. 17, 2014

Related U.S. Application Data

(60) Provisional application No. 61/751,966, filed on Jan. 14, 2013.

(51) Int. Cl.
*G11C 11/02* (2006.01)
*G11C 11/16* (2006.01)
(Continued)

(52) U.S. Cl.
CPC ............ *G11C 11/02* (2013.01); *G11C 11/1673* (2013.01); *G11C 14/0081* (2013.01); *H03K 3/0375* (2013.01)

(58) Field of Classification Search
CPC ...... G11C 11/02; G11C 11/44; H01L 39/221; H03K 19/1952; H03K 3/38
USPC ................................ 326/1–3, 12, 46; 365/158
See application file for complete search history.

(56) References Cited

U.S. PATENT DOCUMENTS

| 5,105,388 | A | 4/1992 | Itano et al. | |
|---|---|---|---|---|
| 5,909,449 | A | 6/1999 | So et al. | |
| 6,317,359 | B1 * | 11/2001 | Black et al. | 365/158 |

(Continued)

FOREIGN PATENT DOCUMENTS

JP 2012124703 A 6/2012

OTHER PUBLICATIONS

International Search Report and Written Opinion—PCT/US2014/011466—ISA/EPO—Apr. 9, 2014.

*Primary Examiner* — Crystal L Hammond
(74) *Attorney, Agent, or Firm* — Nicholas J. Pauley; Peter Michael Kamarchik; Paul Holdaway

(57) ABSTRACT

A magnetic tunneling junction non-volatile register with feedback for robust read and write operations. In an embodiment, two MTJ devices are configured to store a logical 0 or a logical 1, and are coupled to drive an output node to a voltage indicative of the stored logical 0 or a logical 1. The output of a D flip-flop is fed to the two MTJ devices so that the state of the D flip-flop may be stored in the two MTJ devices during a store operation. During a read operation, the D flip-flop outputs the state of the two MTJ devices. Read disturbances are mitigated with the use of an edge detector coupled to the output node, so that a LOW voltage is provided to the D flip-flop if a rising voltage at the output node is detected.

24 Claims, 5 Drawing Sheets

(51) Int. Cl.
  *G11C 14/00* (2006.01)
  *H03K 3/037* (2006.01)

(56) References Cited

U.S. PATENT DOCUMENTS

| | | | |
|---|---|---|---|
| 6,343,032 B1* | 1/2002 | Black et al. | 365/158 |
| 6,515,895 B2 | 2/2003 | Naji | |
| 6,982,904 B2 | 1/2006 | Shiga | |
| 6,992,935 B2* | 1/2006 | Ooishi | 365/189.05 |
| 7,961,005 B1* | 6/2011 | Kim et al. | 326/46 |
| 8,243,502 B2* | 8/2012 | Sakimura et al. | 365/158 |
| 8,406,064 B2* | 3/2013 | Jung et al. | 365/189.05 |
| 8,670,266 B2* | 3/2014 | Jung et al. | 365/158 |
| 2003/0218901 A1* | 11/2003 | Ooishi et al. | 365/157 |
| 2003/0235069 A1* | 12/2003 | Ooishi et al. | 365/158 |
| 2004/0027907 A1* | 2/2004 | Ooishi | 365/226 |
| 2004/0062074 A1* | 4/2004 | Ooishi | 365/158 |
| 2004/0066669 A1* | 4/2004 | Ooishi | 365/173 |
| 2007/0279970 A1* | 12/2007 | Katti | 365/158 |
| 2010/0073991 A1* | 3/2010 | Yamada et al. | 365/148 |
| 2010/0289525 A1* | 11/2010 | Kawakami et al. | 326/46 |
| 2011/0273925 A1* | 11/2011 | Yamamoto et al. | 365/154 |
| 2012/0026783 A1* | 2/2012 | Jung et al. | 365/158 |
| 2012/0218815 A1 | 8/2012 | Kim et al. | |
| 2013/0194862 A1* | 8/2013 | Jung et al. | 365/158 |
| 2014/0003124 A1* | 1/2014 | Youn et al. | 365/148 |

\* cited by examiner

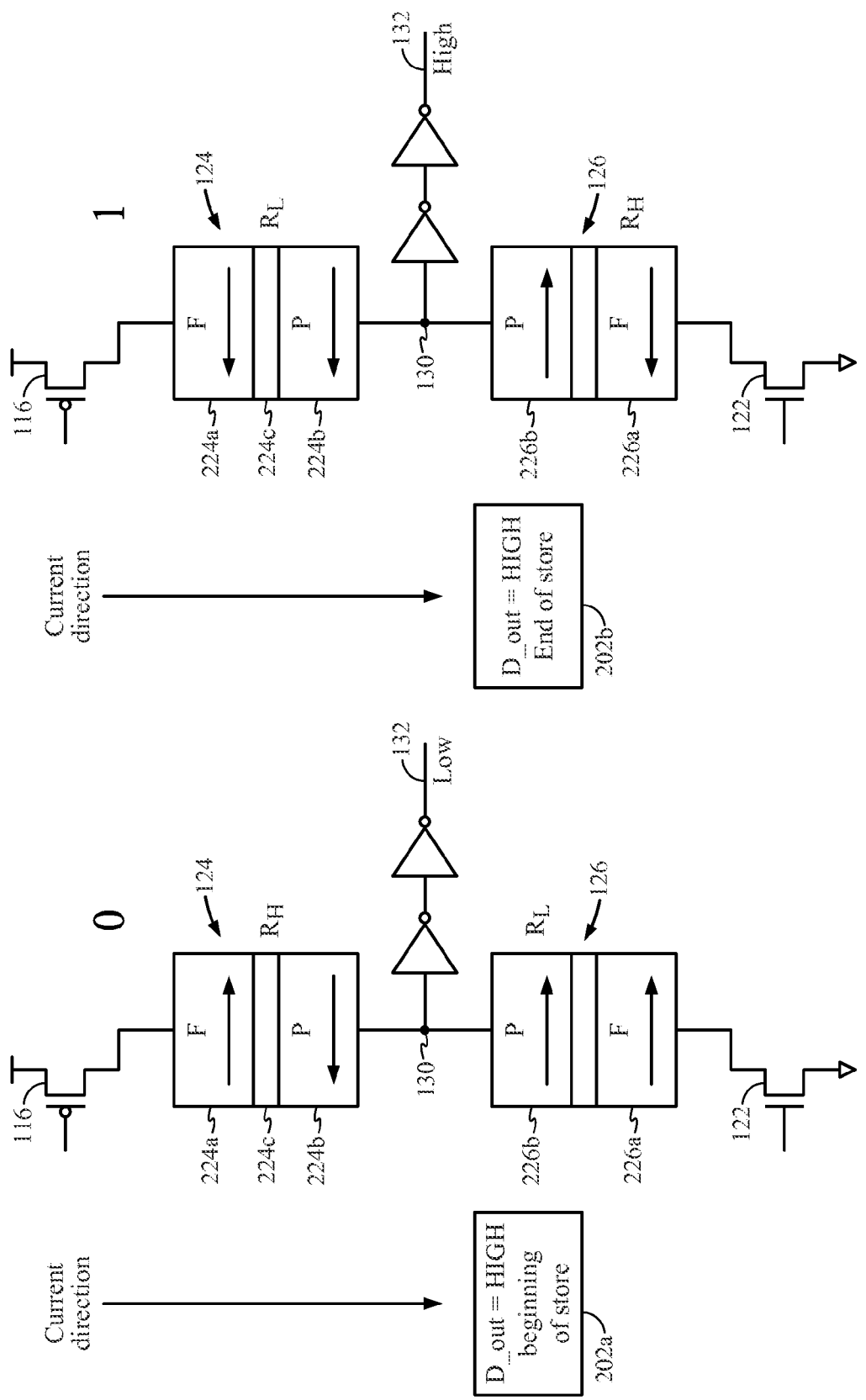

MAGNETIC TUNNELING JUNCTION NON-VOLATILE REGISTER WITH FEEDBACK FOR ROBUST READ AND WRITE OPERATIONS

CLAIM OF PRIORITY UNDER 35 U.S.C. §119

The present Application for Patent claims priority to Provisional Application No. 61/751,966 entitled "MAGNETIC TUNNELING JUNCTION NON-VOLATILE REGISTER WITH FEEDBACK FOR ROBUST READ AND WRITE OPERATIONS" filed Jan. 14, 2013, and assigned to the assignee hereof and hereby expressly incorporated by reference herein.

FIELD OF DISCLOSURE

The present invention relates to electronic circuits, and more particularly, to non-volatile memory using magnetic tunneling junction devices.

BACKGROUND

Many mobile electronic devices are designed to power down various circuit elements, or entire circuits, when not needed so as to conserve battery power. Some circuit elements with state, such as for example clocked flip-flops, may be part of a circuit that is powered down to save power. However, the memory of many such sequential logic circuit elements is volatile in the sense that it is lost by the circuit elements when they are powered down. When such circuit elements are turned back on, their state should be restored to what it was before they were powered down so that the mobile electronic device operates properly.

Accordingly, before powering down a sequential logic circuit element with volatile state so as to save power when it is not needed, the circuit element's state may be stored in non-volatile memory. When the circuit element is to be turned back on, its prior state may be recalled from the non-volatile memory and loaded into the circuit element. It is desirable that such store and recall operations are performed in a robust manner.

SUMMARY

Embodiments of the invention are directed to systems and method for robust read and write operations with magnetic tunneling junction devices.

In an embodiment, a circuit includes a first MTJ device and a second MTJ device to store a logical 0 or a logical 1 The first and second MTJ devices are coupled to an output node to drive the output node to a voltage indicative of the stored logical 0 or logical 1. A multiplexer is coupled to the output node, and a flip-flop is coupled to the multiplexer. An edge detector is coupled to the output node and to the multiplexer so that during a read operation on the first and second MTJ devices, a rising voltage from LOW to HIGH at the output node causes the edge detector to set the multiplexer to provide a LOW voltage to the flip-flop.

In another embodiment, a circuit includes a storage element, where the storage element includes a first MTJ device and a second MTJ device to store a logical 0 or a logical The storage element drives an output node to a voltage indicative of the stored logical 0 or a logical 1. A first multiplexer has a first input port coupled to the output node, a second input port to receive a LOW voltage when selected, and an output port. A second multiplexer has a first input port, a second input port coupled to the output port of the first multiplexer, and an output port. A flip-flop has an input port coupled to the output port of the second multiplexer, and an output port. A feedback path couples the output port of the flip-flop to the storage element to write data to the storage element during a e operation. An edge detector is coupled to the output node and is coupled to a selection port of the first multiplexer so that during a read operation on the storage element, a rising voltage at the output node causes the edge detector to drive a selection port of the first multiplexer to select the second input port of the first multiplexer.

In another embodiment, a circuit includes: a means for storing to store a logical 0 or a logical 1, the means for storing comprising a first MTJ device, a second MTJ device, and an output node; a means for multiplexing coupled to the output node; a means for latching coupled to the multiplexer; and a means for edge detecting coupled to the output node and to the means for multiplexing so that during a read operation on the means for storing, a rising voltage from LOW to HIGH at the output node causes the means for edge detecting to set the means for multiplexing to provide a LOW voltage to the means for latching.

In another embodiment, a method, during a store operation on a storage element comprising a first MTJ device and a second MTJ device, comprises: disabling a clock signal to a flip-flop; coupling an output port of the flip-flop to the storage element; switching a current through the storage element in a first direction when storing a logical 1 in the storage element; and switching a current through the storage element in a second direction when storing a logical 0 in the storage element.

In another embodiment, a method, during a read operation on a storage element comprising a first MTJ device and a second MTJ device, comprises: coupling an input port of the flip-flop to an output port of the storage element; switching a current through the storage element in a first direction; and providing a LOW voltage to the input port of a flip-flop in response to the output port of the storage element having a voltage that starts rising from a LOW voltage to a voltage.

BRIEF DESCRIPTION OF THE DRAWINGS

The accompanying drawings are presented to aid in the description of embodiments of the invention and are provided solely for illustration of the embodiments and not limitation thereof.

FIG. 2A illustrates an embodiment in which a logical 0 is presently stored by combination of the MTJ devices, where a read operation is just beginning, or where a store operation of a logical 1 is just beginning.

FIG. 2B illustrates an embodiment in which a logical 1 is presently stored by the combination of the MTJ devices, where a read operation is performed, or where a store operation of a logical 1 has completed.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. Specific circuits (e.g., application specific integrated circuits (ASICs)), program instructions being executed by one or more processors, or a combination of both, may perform the various actions described herein. Additionally, the sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Embodiments include a pair of serially connected magnetic tunneling junction devices to serve as a non-volatile memory cell for storing one bit of information associated with the state of a sequential logic circuit element, such as for example a flip-flop. In practice, the sequential logic circuit element is part of a larger circuit that includes a plurality of sequential logic circuit elements, and there is a plurality of memory cells, each memory cell for storing the state of a corresponding sequential logic circuit element, and where each memory cell includes a pair of serially connected magnetic tunneling junction devices. When a sequential logic circuit element is to be powered down, its state is stored in its corresponding non-volatile memory cell: and when it is powered back on, its state prior to being powered down is recalled from the non-volatile memory.

Figure 1:
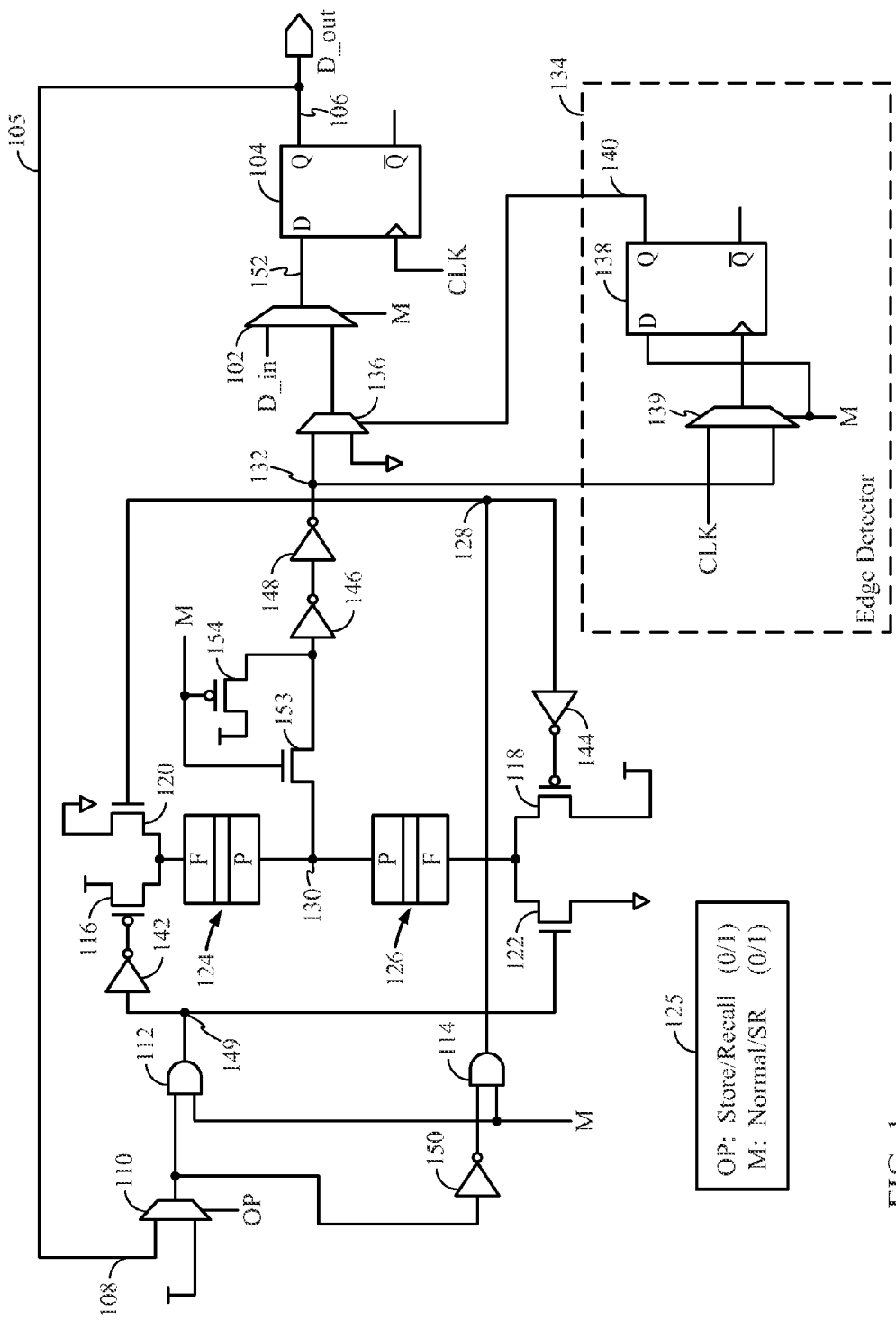
FIG. 1 illustrates an embodiment of the present invention.

FIG. 1 is a circuit diagram illustrating an embodiment. In the particular embodiment of FIG. 1, the D flip-flop 104 is a sequential logic circuit element where its state is stored in non-volatile memory before being powered down, and where the stored state is recalled when being powered up. Embodiments are not limited to where flip-flops are the sequential logic circuit elements for which state is stored and recalled from non-volatile memory.

The signals denoted OP and M set the mode of operation. The signal M determines which mode the circuit operates in, termed herein a "normal" mode and a "store-recall" mode. When the signal M is LOW (e.g., the substrate or ground voltage $V_{SS}$, or a logical 0), the circuit operates in the normal mode. In normal mode, the sequential logic circuit element, which is the D flip-flop 104 in the particular embodiment of FIG. 1, operates in normal fashion in a powered-up state. When the signal M is HIGH (e.g., the supply voltage Vdd, or a logical 1), the circuit operates in the store-recall mode.

In the normal mode, the multiplexer 102 is set to provide the signal D_in to the D flip-flop 104. (Here, we follow the convention that when the select port to a multiplexer is LOW or a logical 0, the top input port is selected, whereas if the select port is HIGH or a logical 1, the bottom input port is selected.) The D flip-flop 104 may be either a rising-edge or failing-edge triggered D flip-flop 104. In the particular embodiment of FIG. 1, the D flip-flop 104 is a rising-edge triggered flip-flop. More generally, other sequential logic circuit elements, such as various types of latches, may be used in place of the D flip-flop 104, but for ease of discussion a D flip-flop is considered.

The magnetic tunneling junction (MTJ) devices 124 and 126 are serially connected and serve as part of a memory cell or storage element for storing one bit of information. The way in which the one bit of information is stored and recalled will be discussed in more detail later. During the normal mode, the pass nMOSFET 153 is turned OFF to decouple the MTJ devices 124 and 126 from the node 132, and the pullup pMOSFET 154 is turned ON so that the node 132 is kept HIGH. Furthermore, note the feedback path 105 from the output port 106 of the D flip-flop 104 to the input port 108 of the multiplexer 110. During the normal mode with the signal M set to LOW, the AND gates 112 and 114 output a LOW signal. This keeps OFF the pullup pMOSFETs (p-Metal Oxide Semiconductor Field Effect Transistor) 116 and 118 and the pulldown nMOSFETs 120 and 122, thereby effectively isolating the MTJ devices 124 and 126 from the rest of the circuit.

Accordingly, in the normal mode the feedback path 105 does not come into play, there is no storing or reading (recall) operations performed on the MTJ devices, and the output D_out is determined by the input D_in and the state of the D flip-flop 104 in accordance with the functionality of the D flip-flop 104.

When the signal M is HIGH, the circuit operates in the store-recall mode. In this mode, the pullup pMOSFET 154 is turned OFF, and the pass nMOSFET 153 is turned ON so that the node 130 is coupled to the node 132. In the store-recall mode, a store operation is performed on the MTJ devices 124 and 126 when the signal OP is set to LOW, and a read (recall) operation is performed on the MTJ devices 124 and 126 when the signal OP is set to HIGH. The key 125 compactly indicates the values of the signals OP and M corresponding to the various modes and operations, where "SR" stands for the store-recall mode.

The MTJ devices 124 and 126 may be viewed as forming a storage element (cell). In another view, the MTJ devices 124 and 126 may form part of a storage element, where transistors 116, 118, 120, and 122 may be viewed as also forming part of the storage element.

Consider a store operation, where the signal M is set to HIGH and the signal OP is set to LOW. With the signal M set to HIGH, the output voltages of the AND gates 112 and 114 are now responsive to the output voltage of the multiplexer 110; and with the signal OP set to LOW, the select port of the multiplexer 110 is LOW so that the input port 108 is selected for the output of the multiplexer 110. Thus, the feedback path 105 comes into play, and the voltages at nodes 149 and 128 are D_out and D_out#, respectively. Here, the voltage D_out# denotes the logical complement of the voltage D_out.

Suppose the voltage D_out is HIGH during the store operation. Then the pullup pMOSFET 116 and the pulldown nMOSFET 122 are turned ON, and both pullup pMOSFET 118 and pulldown nMOSFET 120 are turned OFF. This leads to the effective circuit configurations of FIGS. 2A and 2B, where the current direction is from the pullup pMOSFET 116 to the pulldown nMOSFET 122. Arrows labeled "current direction" indicate the current flow. FIG. 2A illustrates the beginning of a store operation for a logical 1 in which a logical 0 is initially stored by the configuration of the MTJ devices 124 and 126, and FIG. 2B illustrates the end of the store operation in which a logical 1 is stored. The keys 202$a$ and 202$b$ indicate that D_out with a voltage (logical 1) is being stored, and also indicate the beginning or end of the store operation.

In FIG. 2A, the magnetic polarizations of the free layer 224$a$ and the pinned layer 224$b$ are such that the MTJ device 124 is in a high resistance state, indicated by the label "$R_H$". (Note that the insulator layer for the MTJ device 124 is labeled 224$c$, but other components and features of an MTJ device, such as a substrate or one or more conductive layers, are not illustrated for the MTJ devices so as to simplify the drawings.) The magnetic polarizations of the free layer 226$a$ and the pinned layer 226$b$ illustrated in FIG. 2A are such that the MTJ device 126 is in a low resistance state, indicated by the label "$R_L$". If, for example, the ratio of high resistance to low resistance is 2, then the voltage at node 130 at the beginning of the store operation in FIG. 2A would be $(V_{DD}-V_P-V_N)/3$, where $V_P$ denotes the source-drain voltage drop across pMOSFET 116 when ON, and $V_N$ denotes the source-drain voltage drop across nMOSFET 122 when ON.

At the end of the store operation, the spin current due to the current flow flips the magnetic polarization states of the free layers 224$a$ and 226$a$, so that the configuration looks like FIG. 2B. In the configuration of FIG. 2B, the MTJ device 124 is in the low resistance state, and the MTJ device 126 is in the high resistance state. If again, for example, the ratio of high resistance to low resistance is 2, then the voltage at node 130 at the end of the store operation in FIG. 2B would be $(2/3)(V_{DD}-V_P-V_N)$. The voltage at the output node 132 changes from LOW in FIG. 2A to HIGH in FIG. 2B for the store operation.

During a store operation, the clock signal to the D flip-flop 104 is disabled, otherwise the voltage rise at the output node 132 during the store operation illustrated in FIGS. 2A and 2B could, because of the edge detector 134, input a logical 0 to the D flip-flop 104, thereby changing the value of the output port 106, which would also cause a problem due to the feedback path 105. The role that the edge detector 134 plays is explained in more detail later.

Figure 3B:
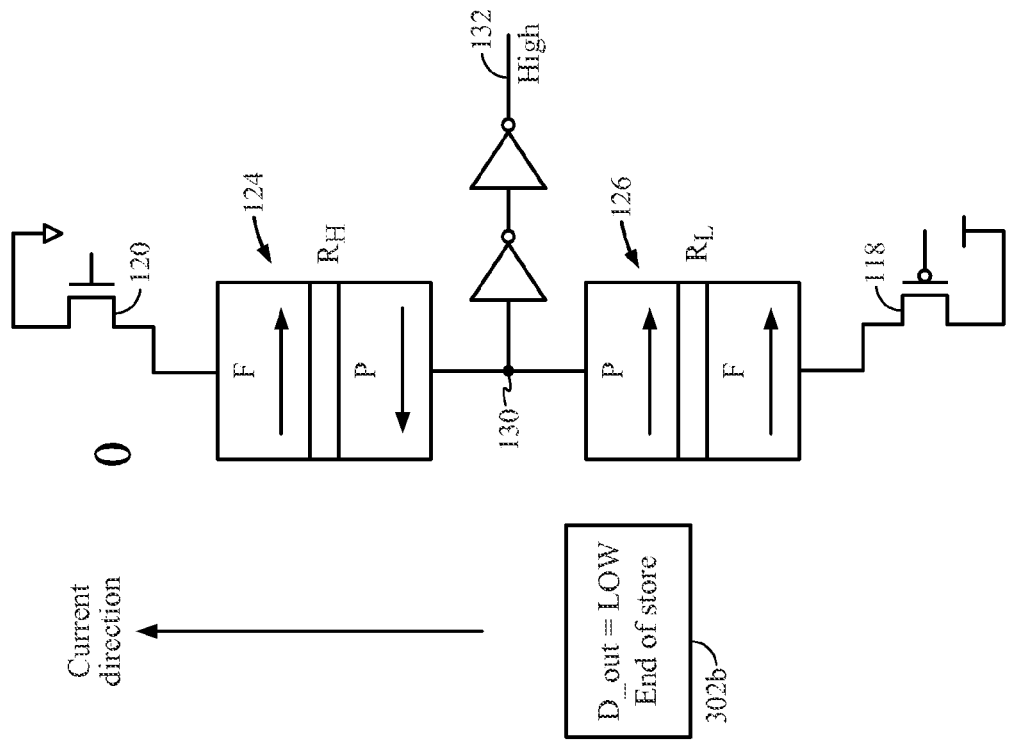
FIG. 3B illustrates an embodiment in which a store operation of a logical 0 has completed.
Figure 3A:
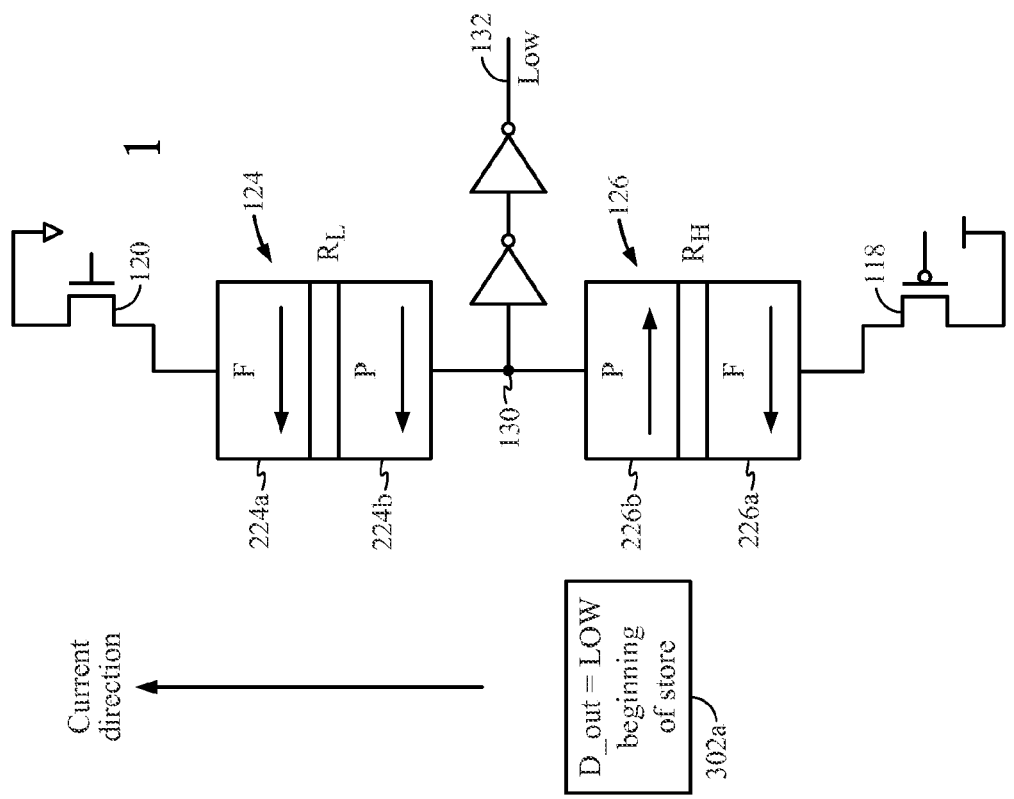
FIG. 3A illustrates an embodiment in which a logical 1 is presently stored by the combination of the MTJ devices, where a store operation of a logical 0 is just beginning.

Suppose the voltage D_out is LOW during the store operation. Then the pullup pMOSFET 118 and pulldown nMOSFET 120 are turned ON, and both pullup pMOSFET 116 and pulldown nMOSFET 122 are turned OFF. This leads to the effective circuit configurations of FIGS. 3A and 3B, where the current direction is from the pullup pMOSFET 118 to the pulldown nMOSFET 120. Arrows labeled "current direction" indicate the current flow. FIG. 3A illustrates the beginning of a store operation in which a logical 1 was initially stored by the configuration of the MTJ devices 124 and 126, and FIG. 3B illustrates the end of the store operation in which a logical 0 is stored. The keys 302$a$ and 302$b$ indicate that D_out=LOW, and also indicate respectively the beginning and end of the store operation.

In FIG. 3A, the magnetic polarizations of the free layer 224$a$ and the pinned layer 224$b$ are such that the MTJ device 124 is in a low resistance state. The magnetic polarizations of the free layer 226$a$ and the pinned layer 226$b$ illustrated in FIG. 3A are such that the MTJ device 126 is in a high resistance state. If, for example, the ratio of high resistance to low resistance is 2, then the voltage at node 130 at the beginning of the store operation in FIG. 3A would be $(V_{DD}-V_P-V_N)/3$, where $V_P$ denotes the source-drain voltage drop across pMOSFET 118 when ON, and denotes the source-drain voltage drop across nMOSFET 120 when ON. For simplicity, the symbols for the voltage drops across transistors 118 and 120 are the same as the symbols used for the voltage drops across transistors 116 and 122.

Note that the polarizations for the free layers in FIG. 3A represent a stored logical 1, and the polarizations for the free layers in FIG. 2A represent a stored logical 0, and yet the voltages at nodes 130 and 132 are the same for these figures during a store operation.

At the end of the store operation, the spin current due to the current flow flips the magnetic polarization states of the free layers 224$a$ and 226$a$, so that the configuration looks like FIG. 3B. In the configuration illustrated in FIG. 3B, the MTJ device 124 is in the high resistance state, and the MTJ device 126 is in the low resistance state. If again, for example, the ratio of high resistance to low resistance is 2, then the voltage at node 130 at the end of the store operation in FIG. 3B would be $(2/3)(V_{DD}-V_P-V_N)$. The voltage at the output node 132 changes from LOW in FIG. 3A to HIGH in FIG. 3B during the store operation. This is the same voltage transition as in FIGS. 2A and 2B, even though the initial state in FIG. 2A is complementary to that of FIG. 3A, and the final state in FIG. 2A is complementary to that of FIG. 3A.

More generally stated, regardless of the initial state, when storing a logical 1 or a logical 0 in the circuit structure comprising the MTJ devices 124 and 126, the voltage at the output node 132 at the end of the store operation is HIGH. Because of the pullup pMOSFET 154, the output node 132 is HIGH just before the beginning of a store operation. Consequently, when a store operation changes the bit stored by the MTJ devices 124 and 126, the output node 132 transitions from HIGH to LOW during a small time interval, and then rises to HIGH when the polarizations of the MTJ devices 124 and 126 have changed; whereas when a store operation does not change the stored bit, the output node 132 stays HIGH.

Therefore, when performing a store operation, some embodiments monitor the voltage at the output node 132 starting at some small time interval after the store operation begins, where the small time interval takes into account the possible HIGH to LOW transition at the output node 132. Once the output node 132 is determined HIGH, then the store operation may be stopped and the D flip-flop 104 may be powered down. Accordingly, such embodiments are expected to improve the store operation time.

Now consider a read operation in which the signal M is set to HIGH and the signal OP is set to HIGH. In this case, the multiplexer 110 provides the HIGH voltage $V_{DD}$ as its output voltage, resulting in the pullup pMOSFET 116 and the pulldown 122 being turned ON, and the pullup pMOSFET 118 and the pulldown nMOSFET 120 being turned OFF. This leads to the same effective circuit configurations as in FIGS. 2A and 2B, where the configuration of FIG. 2A represents a stored logical 0 and the configuration of FIG. 2B represents a stored logical 1. For a read operation, the keys 202$a$ and 202$b$ should be ignored in FIGS. 2A and 2B.

Because the circuit configuration for the MTJ devices 124 and 126 in FIG. 2A represents both a store operation of a logical 1 and a read operation in which a logical 0 is initially stored, the voltage at the output port 132 may transition from LOW to HIGH. But for a read operation, this would be considered a read disturbance if not properly taken into account. This is where the edge detector 134 plays an important role.

Before a read operation begins, it is assumed that the output port 140 is LOW to set the multiplexer 136 to select the output node 132. Consider the read operation of a logical 0. The signal M is set to HIGH. The select port to the multiplexer 102 is thereby set HIGH so that the multiplexer 102 selects the output of the multiplexer 136, and the multiplexer 139 is set to select the output node 132. Recall that the pullup pMOSFET 154 keeps the output node 132 HIGH during the normal mode. Thus, just before the beginning of a read operation, the selection states of the multiplexers 136 and 102 are such that a HIGH voltage is provided to the input port 152 of the D flip-flop 104.

As a read operation of a logical 0 begins, the voltage at the node 132 is pulled to LOW (where the circuit configuration is that of FIG. 2A). The voltage at the node 132 will start to rise, and if the edge detector 134 were not present, the voltage at the node 132 would rise to HIGH. However, the voltage rise at the output port 132 triggers the D flop 138 of the edge detector 134, so that the voltage at the output port 140 switches from LOW to HIGH. This causes the multiplexer 136 to select the LOW voltage, thereby providing the LOW voltage as the input to the multiplexer 102, in which case the input to the D flip-flop is kept LOW and stays LOW during the read operation. Consequently, the correct result is obtained at the output port 106 for the signal D_out when the clock signal CLK triggers the D flip-flop 104. Read disturbance is mitigated.

Consider a read operation of a logical 1 (see FIG. 2B). Because of the polarization states of the free layers, there is no change in the state of the MTJ devices 124 and 126, and the voltage at the output node 132 stays HIGH. Consequently, the D flip-flop 138 is not triggered, and the HIGH voltage is provided to the input port of the D flip-flop 104, in which case the correct result is provided at the output port 106 for the signal D_out when the clock signal CLK triggers the D flip-flop 104.

Figure 4A:
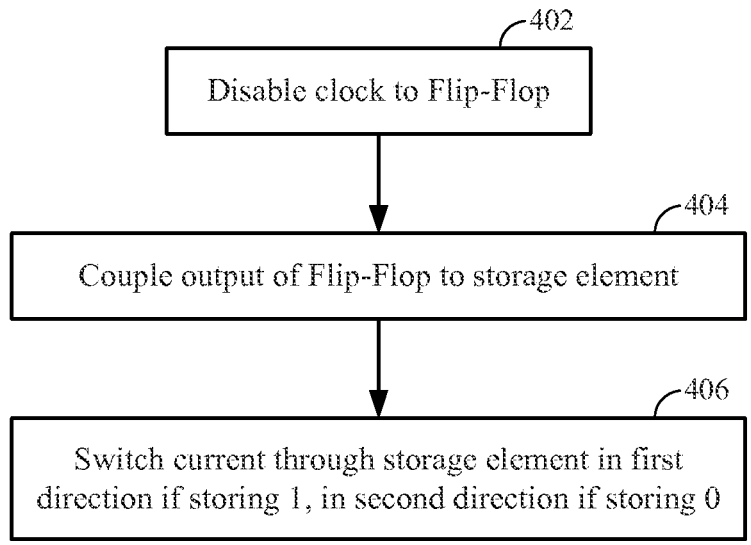
FIG. 4A illustrates a flow diagram for implementing a store operation according to an embodiment.
Figure 4B:
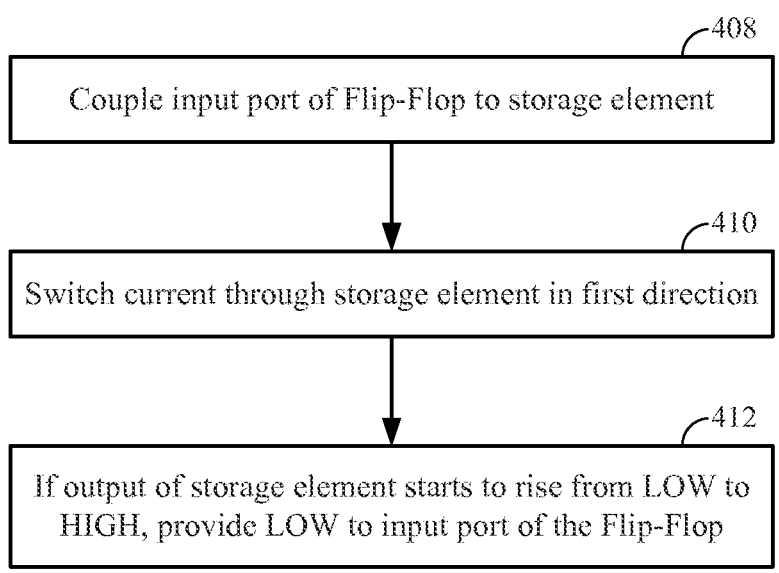
FIG. 4B illustrates a flow diagram for implementing a read operation according to an embodiment.

The flow diagrams illustrated in FIGS. 4A and 4B illustrate, respectively, some aspects of the store and read operations discussed above. Referring to FIG. 4A, in performing a store operation, the clock signal is prevented from triggering the D flip-flop 104, as indicated in the box labeled 402. For example, the clock signal CLK may be decoupled from the clock input port of the D flip flop 104.

As indicated in the box labeled 404, the output port of the D flip-flop 104 is coupled to the storage element. For example, as discussed previously with respect to FIG. 1, the feedback path 105 couples the output port 106 of the D flip-flop 104 to the input port 108 of the multiplexer 110. The storage element referred to in the box 404 may be viewed as comprising the combination of the MTJ devices 124 and 126, the transistors 116, 118, 120, and 122, and the inverters 142, 144, 146, and 148. The output port of the multiplexer 110 is coupled to the node 149 of the storage element by way of the AND gates 112 and 114 and the inverter 150. In this way, the feedback path 105 couples the output port 106 to the storage element.

In box 406, current is switched through the storage element first direction when storing a logical 1, and in a second direction (opposite to the first direction) when storing a logical 0. For example, as discussed with respect to FIG. 2A, when storing a logical 1 corresponding to the output port signal D_out being HIGH, transistors 116 and 122 are switched ON so that current flows in a direction indicated in FIG. 2A, flowing from MTJ device 124 toward MTJ device 126. As discussed with respect of FIG. 3A, when storing a logical 0, corresponding to the output port signal D_out being LOW, transistors 118 and 120 are switched ON so that current flows in a direction indicated in FIG. 3A, flowing from MTJ device 126 toward MTJ device 124.

Referring to FIG. 4B, when performing a read (or recall) operation, the input port of the D flip-flop 104 is coupled to the storage element, as indicated in the box labeled 408. For example, at the beginning of a read operation, as described with respect to FIG. 1, the multiplexers 102 and 136 are set so that the voltage at the input port 152 to the D flip-flop 104 follows the voltage of the node 132. This effectively couples the D flip-flop 104 to the storage element, where the node 132 may be viewed as the output port of the storage element.

In box 410, current is switched through the storage element in the first direction. For example, as discussed with respect to FIG. 2A during a read operation when a logical 0 is stored, or respect to FIG. 2B during a read operation when a logical 1 is stored, transistors 116 and 122 are switched ON so that current flows in a direction indicated in FIGS. 2A and 2B, flowing from MTJ device 124 toward MTJ device 126.

In box 412, if during a read operation the output of the storage element starts to rise from LOW to HIGH, then a LOW input is provided to the input port of the D flip-flop 104. For example, as discussed with respect to FIG. 1, the edge detector 134 comes into play during a read operation when the voltage at the node 132 starts to rise from LOW to HIGH. When this happens, the multiplexer 136 is set to select the LOW voltage as its input, so that a LOW voltage is provided to the input port 152 of the D flip-flop 104 via the multiplexer 102.

Figure 5:
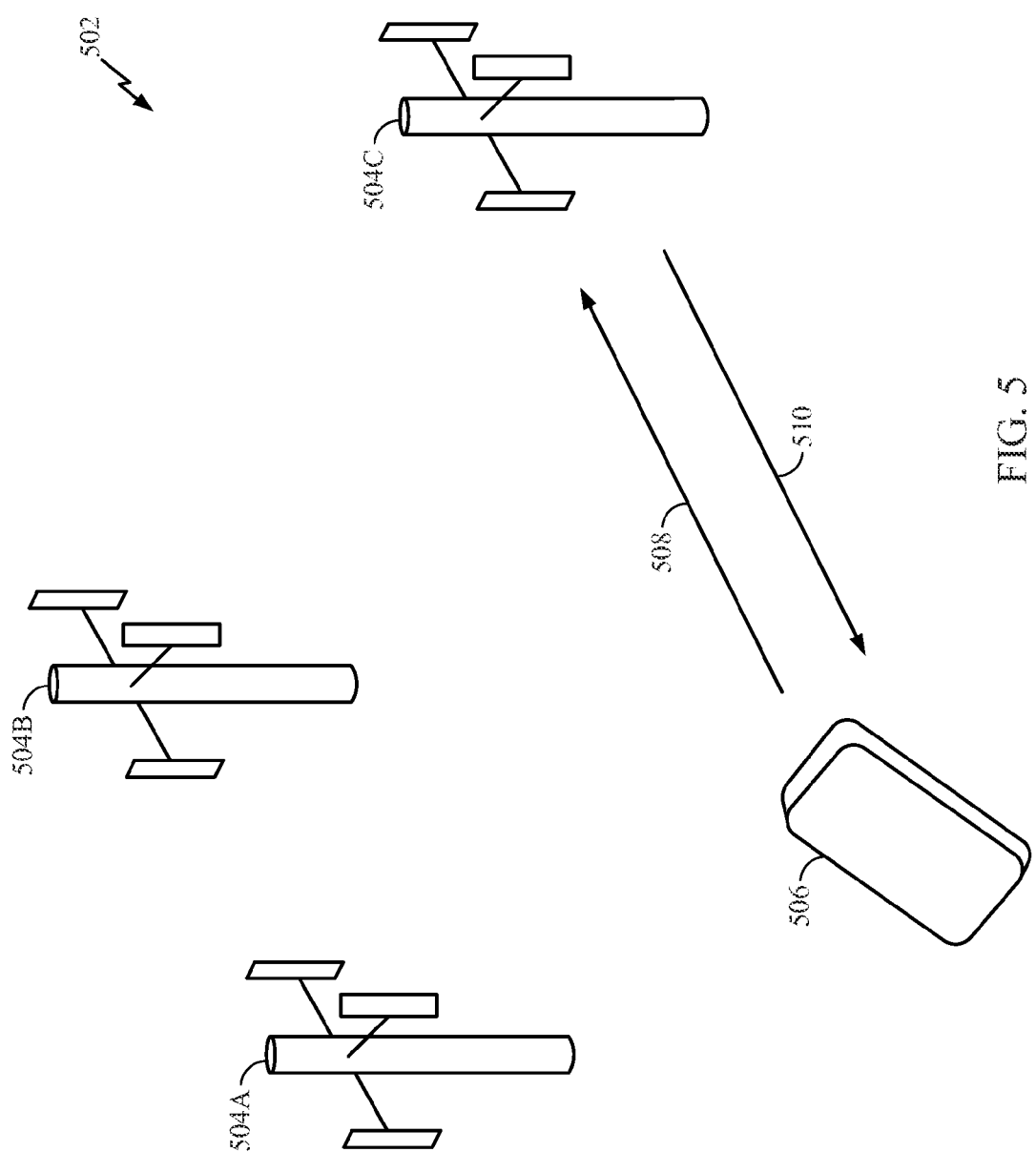
FIG. 5 illustrates a wireless communication network in which an embodiment may find application.

FIG. 5 illustrates a wireless communication system in which embodiments may find application. FIG. 5 illustrates a wireless communication network 502 comprising base stations 504A, 504B, and 504C. FIG. 5 shows a communication device, labeled 506, which may be a wireless communication device such as a smart phone, a tablet, a computer or computer system, or some other kind of communication device suitable for a cellular phone network. The communication device 506 need not be mobile. In the particular example of FIG. 5, the communication device 506 is located within the cell associated with the base station 504C. Arrows 508 and 510 pictorially represent the uplink channel and the downlink channel, respectively, by which the communication device 506 communicates with the base station 504C.

Embodiments may be used in data processing systems associated with the communication device 506, or with the base station 504C, or both, for example. FIG. 5 illustrates only one application among many in which the embodiments described herein may be employed Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the a will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for embodiments as described herein. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A circuit comprising:
    a first magnetic tunneling junction (MTJ) device;
    a second MTJ device coupled to the first MTJ device, so that the first and second MTJ devices store a logical 0 or a logical 1;
    an output node, the first and second MTJ devices coupled to the output node to drive the output node to a voltage indicative of a logical 0 or a logical 1;
    a multiplexer coupled to the output node;
    a sequential logic circuit element having an input port coupled to the multiplexer, the sequential logic circuit element having an output port;
    a feedback path coupling the output port of the sequential logic circuit element to the first MTJ device and the second MTJ device to write data to the first MTJ device and the second MTJ device during a write operation; and
    an edge detector coupled to the output node and to the multiplexer so that during a read operation on the first and second MTJ devices, the edge detector sets the multiplexer to provide a LOW voltage to the input port of the sequential logic circuit element if the voltage of the output node starts to rise from LOW to HIGH and sets the multiplexer to provide the voltage of the output node to the input port of the sequential logic circuit element otherwise.

2. The circuit of claim 1, wherein the sequential logic circuit element is a rising-edge D flip-flop.

3. The circuit of claim 1,
    the multiplexer having a selection port, an output port, a first input port connected to the output node, and a second input port to provide a LOW voltage when selected; and
    the circuit further comprising:
        a second multiplexer having an output port connected to the input port of the sequential logic circuit element, and an input port connected to the output port of the multiplexer.

4. The circuit of claim 3, wherein the second multiplexer selects the output port of the multiplexer during a read operation.

5. The circuit of claim 3, the edge detector comprising:
    a third multiplexer having a selection port, a first input port to receive a clock signal when selected, a second input port connected to the output node, and an output port; and
    a flip-flop having an input port connected to the selection port of the third multiplexer, a clock input port connected to the output port of the third multiplexer, and an output port connected to the selection port of the multiplexer.

6. The circuit of claim 1,
    the multiplexer having a selection port, an output port coupled to the sequential logic circuit element, a first input port connected to the output node, and a second input port to provide a LOW voltage when selected; and
    the edge detector comprising:
        a second multiplexer having a selection port, a first input port to receive a clock signal when selected, a second input port connected to the output node, and an output port; and
        a flip-flop having an input port connected to the selection port of the second multiplexer, a clock input port connected to the output port of the second multiplexer, and an output port connected to the selection port of the multiplexer.

7. The circuit of claim 1, wherein the circuit is included in a device selected from the group consisting of a cellular phone, a base station, and a computer system.

8. A circuit comprising:
    a storage element comprising
        a first magnetic tunneling junction (MTJ) device;
        a second MTJ device coupled to the first MTJ device, so that the first and second MTJ devices store a logical 0 or a logical 1;
    an output node, the storage element to drive the output node to a voltage indicative of the stored logical 0 or a logical 1;
    a first multiplexer having a selection port, a first input port coupled to the output node, a second input port to receive a LOW voltage when selected, and an output port;
    a second multiplexer having a selection port, a first input port, a second input port coupled to the output port of the first multiplexer, and an output port;
    a sequential logic circuit element having an input port coupled to the output port of the second multiplexer, and an output port;
    a feedback path coupling the output port of the sequential logic circuit element to the storage element to write data to the storage element during a write operation; and
    an edge detector coupled to the output node and coupled to the selection port of the first multiplexer so that during a read operation on the storage element, the edge detector drives the selection port of the first multiplexer to select the second input port of the first multiplexer if the voltage at the output node starts to rise from LOW to HIGH and drives the selection port of the first multiplexer to select the first input port of the first multiplexer otherwise.

9. The circuit of claim 8, the storage element further comprising:
a first pullup pMOSFET connected to the first MTJ device;
a second pullup pMOSFET connected to the second MTJ device;
a first pulldown nMOSFET connected to the first MTJ device; and
a second pulldown nMOSFET connected to the second MTJ device.

10. The circuit of claim 9, the feedback path, during an operation to store a logical 1, to
turn ON the first pullup pMOSFET and turn ON the second pulldown nMOSFET;
turn OFF the second pullup pMOSFET and turn OFF the first pulldown nMOSFET;
and, during an operation to store a logical 0, to
turn ON the second pullup pMOSFET and turn ON the first pulldown nMOSFET; and
turn OFF the first pullup pMOSFET and turn OFF the second pulldown nMOSFET.

11. The circuit of claim 10, further comprising:
a third multiplexer having an input port coupled to the feedback path, and an output port coupled to the storage element.

12. The circuit of claim 10, the edge detector comprising:
a third multiplexer having a selection port, a first input port to receive a clock signal when selected, a second input port connected to the output node, and an output port; and
a flip-flop having an input port connected to the selection port of the third multiplexer, a clock input port connected to the output port of the third multiplexer, and an output port connected to the selection port of the multiplexer.

13. The circuit of claim 8, wherein the circuit is included in a device selected from the group consisting of a cellular phone, a base station, and a computer system.

14. A circuit comprising:
a means for storing a logical 0 or a logical 1, the means for storing comprising a first magnetic tunneling junction (MTJ) device, a second MTJ device, and an output node;
a means for multiplexing coupled to the output node;
a means for latching coupled to the means for multiplexing;
a feedback means for coupling the means for latching to the means for storing to write data to the means for storing during a write operation; and
a means for edge detecting coupled to the output node and to the means for multiplexing so that during a read operation on the means for storing, the means for edge detecting sets the means for multiplexing to provide a LOW voltage to the means for latching if a voltage of the output node starts to rise from LOW to HIGH and sets the means for multiplexing to provide the voltage of the output node to the means for latching otherwise.

15. The circuit of claim 14, wherein the circuit is included in a device selected from the group consisting of a cellular phone, a base station, and a computer system.

16. The circuit of claim 14, wherein the means for latching is a rising-edge D flip-flop.

17. The circuit of claim 14,
the means for multiplexing having a selection port, an output port, a first input port connected to the output node, and a second input port to provide a LOW voltage when selected;
the means for latching having an input port; and
the circuit further comprising:
a second means for multiplexing having an output port connected to the input port of the means for latching, and an input port connected to the output port of the means for multiplexing.

18. The circuit of claim 17, wherein the second means for multiplexing selects the output port of the means for multiplexing during a read operation.

19. The circuit of claim 17, the means for edge detecting comprising:
a third means for multiplexing having a selection port, a first input port to receive a clock signal when selected, a second input port connected to the output node, and an output port; and
a second means for latching having an input port connected to the selection port of the third means for multiplexing, a clock input port connected to the output port of the third means for multiplexing, and an output port connected to the selection port of the means for multiplexing.

20. The circuit of claim 14,
the means for multiplexing having a selection port, an output port coupled to the means for latching, a first input port connected to the output node, and a second input port to provide a LOW voltage when selected; and
the means for edge detecting comprising:
a third means for multiplexing having a selection port, a first input port to receive a clock signal when selected, a second input port connected to the output node, and an output port; and
a second means for latching having an input port connected to the selection port of the third means for multiplexing, a clock input port connected to the output port of the third means for multiplexing, and an output port connected to the selection port of the means for multiplexing.

21. A method comprising:
disabling a clock signal to a sequential logic circuit element, the sequential logic circuit element comprising a flip-flop;
coupling an output port of the sequential logic circuit element to a storage element comprising a first magnetic tunneling junction (MTJ) device and a second MTJ device serially connected;
switching a current through the storage element in a first direction when storing a logical 1 in the storage element; and
switching a current through the storage element in a second direction when storing a logical 0 in the storage element.

22. The method of claim 21 further comprising:
coupling an input port of the sequential logic circuit element to an output port of the storage element;
switching a current through the storage element in the first direction; and
providing a LOW voltage to the input port of the sequential logic circuit element in response to the output port of the storage element having a voltage that starts rising from a LOW voltage to a HIGH voltage.

23. A method comprising:
coupling an input port of a sequential logic circuit element to an output port of a storage element, the sequential logic circuit element comprising a flip-flop, the storage element comprising a first magnetic tunneling junction (MTJ) device and a second MTJ device serially connected;

switching a current through the storage element in a first direction; and providing a LOW voltage to the input port of the sequential logic circuit element in response to the output port of the storage element having a voltage that starts rising from a LOW voltage to a HIGH voltage.

24. The method of claim 23, further comprising:

monitoring a voltage at an output node coupled to the storage element, the output node indicative of a state of the storage element; and stopping a store operation when the output node is monitored to be a HIGH voltage after a time interval from when the store operation begins.

* * * * *